United States Patent [19]
Watanabe

[11] Patent Number: 5,330,612
[45] Date of Patent: Jul. 19, 1994

[54] METHOD OF FABRICATING NANO-SIZE THIN WIRES AND DEVICES MADE OF SUCH THIN WIRES

[75] Inventor: Masao Watanabe, Sapporo, Japan

[73] Assignee: Advantest Corporation, Tokyo, Japan

[21] Appl. No.: 953,974

[22] Filed: Sep. 30, 1992

[30] Foreign Application Priority Data

Oct. 2, 1991 [JP] Japan .................. 3-255088

[51] Int. Cl.⁵ .................................. C30B 23/00
[52] U.S. Cl. ........................... 117/86; 437/84; 117/87; 117/105; 117/921; 117/938
[58] Field of Search ............... 156/600, 610, 611, 612, 156/DIG. 101; 437/84, 94

[56] References Cited

U.S. PATENT DOCUMENTS

| | | | |
|---|---|---|---|
| 4,983,540 | 1/1991 | Yamaguchi et al. | 437/110 |
| 5,104,824 | 4/1992 | Clausen et al. | 437/90 |
| 5,114,877 | 5/1992 | Paoli et al. | 437/129 |
| 5,202,290 | 4/1993 | Moskovits | 437/233 |
| 5,236,547 | 8/1993 | Takahashi et al. | 437/4 |

FOREIGN PATENT DOCUMENTS

| | | |
|---|---|---|
| 60-130182 | 7/1985 | Japan . |
| 2122682 | 5/1990 | Japan . |
| 3-38824 | 2/1991 | Japan ............... 156/600 |

*Primary Examiner*—Robert Kunemund
*Attorney, Agent, or Firm*—Staas & Halsey

[57] ABSTRACT

A single-crystal substrate is prepared which has the (100) crystal plane with a step line formed therein by cleaving an MgO single crystal. By evaporating metal onto the cleavage plane, with a mask wire of platinum disposed at a distance from the cleavage plane and extended in a direction across the step line, a pair of metal thin film electrodes separated by a gap are epitaxially grown. By this, a step line corresponding to the cleavage-plane step line is formed in the surface of each of the metal thin film electrodes. Metal is further evaporated onto the metal thin film electrodes at a low rate, by which nano-size thin wires extending along the step lines are grown so that they approach each other and are finally connected to each other.

4 Claims, 5 Drawing Sheets

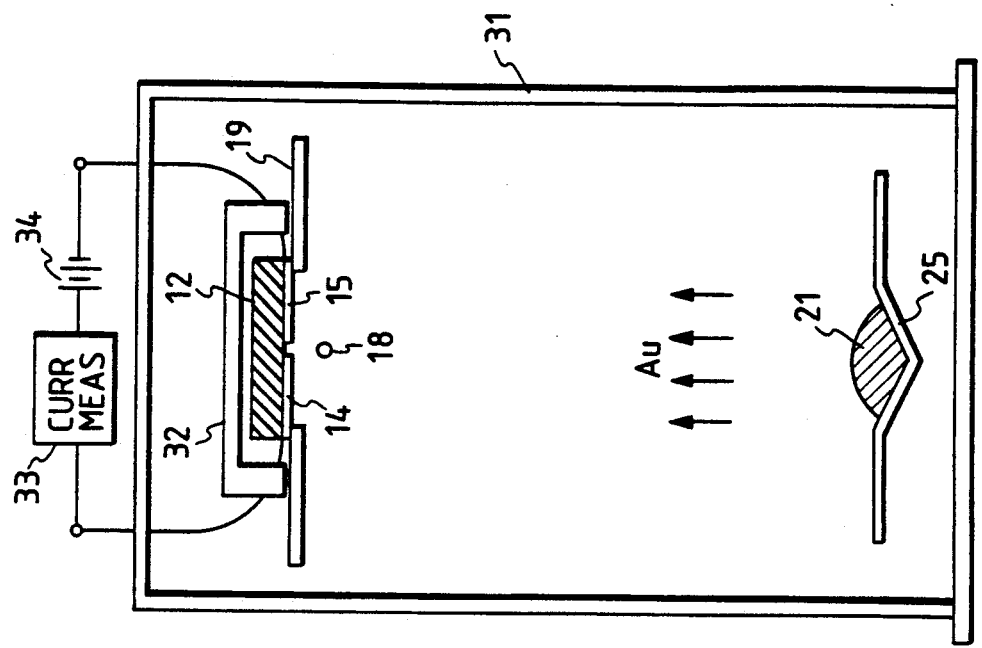
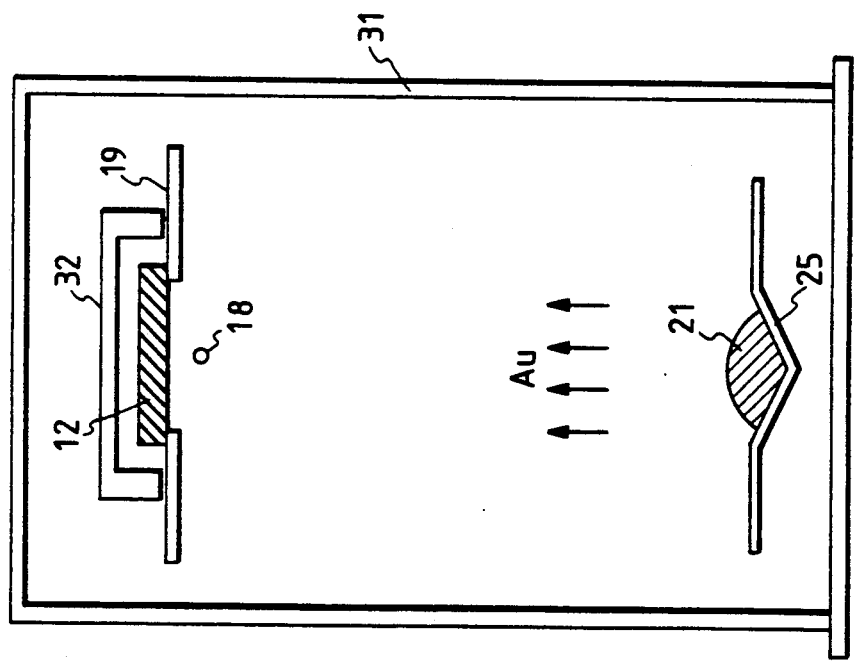

METHOD OF FABRICATING NANO-SIZE THIN WIRES AND DEVICES MADE OF SUCH THIN WIRES

BACKGROUND OF THE INVENTION

The present invention relates to a method of fabricating nano-size thin wires with a diameter of 100 nm or under and devices having such nano-size thin wires.

A thin metallic wire of a 100 nm diameter or smaller has specific properties called quantum conduction phenomena, such as follows: (a) Phase information of conduction electrons survives and the electron wave interference effect becomes obvious. (b) Ohm's law is often broken and the electrical conductivity (and consequently thermal conductivity as well) of the wire depends on the configuration of the metal as well as its diameter and length. (c) The conductivity greatly fluctuates and noise is observed depending on the configuration of the sample and the positions of impurity atoms. (d) A marked surface effect is produced. (e) Visible light enters throughout the thin wire, causing a decrease in its conductivity.

Two methods have been proposed to fabricate nano-size thin wires. According to a first method called the IBM laboratory method, a gold (Au) evaporated film is formed on the surface of a graphite substrate, then an arbitrary thin line, along which a thin wire is desired to obtain, is drawn on the Au evaporated film by means of an electron beam, and at the same time, carbon (C), which results from the decomposition of a residual gas such as $CH_4$, is deposited onto the thin line. After the carbon film is grown to a proper thickness, the Au evaporated film is removed by argon (At) sputtering, and at the same time, the carbon line deposited thereon is also removed. As a result, the gold underlying the carbon thus removed remains unremoved, providing a nano-size thin wire of the same shape as that of the thin line drawn by the electron beam. According to the second method by Yale University, a step line is formed by argon sputtering on the surface of a glass substrate, then a metal thin film is evaporated onto the substrate surface where the step line was formed, and argon sputtering is performed again obliquely, leaving an Au thin wire in the shade of the step line.

With the first-mentioned prior art method in which the Au evaporated film surrounding the thin carbon line and the carbon line deposited on the Au film are removed at the same time and the gold line underlying the carbon line is left unremoved, it is necessary that carbon be deposited thick, and therefore, the Au evaporated film must be scanned repeatedly by the electron beam along the thin line. This consumes much time, and hence constitutes an obstacle to mass production of thin wires and inevitably raises their manufacturing costs. The second-mentioned conventional method is defective in that the crystal growth of the thin wire is not uniform under the influence of the glass substrate and that during sputtering using argon (Ar) ions the thin wire is contaminated (with an impurity entering it) and the wire surface is roughened.

Since the conventional thin wire is formed directly on the substrate as mentioned above, it is likely to be affected physically by an interaction between the substrate and the thin wire. Moreover, there is a fear that atoms forming the substrate and/or impurity elements in the substrate enter into the thin wire to form an alloy which chemically affects the thin wire. In addition, the thin wire cannot be separated from the substrate.

SUMMARY OF THE INVENTION

It is therefore a first object of the present invention to provide a method of fabricating a nano-size thin wire which does not make direct contact with the substrate, and hence is unaffected by the substrate physically and chemically.

A second object of the present invention is to provide a device which has such nano-size thin wires.

The nano-size thin wire fabrication method according to the present invention includes the steps of: providing a single-crystal substrate having a cleavage plane with at least one cleavage-plane step line formed therein by cleaving an ionic single crystal; evaporating a metal onto the cleavage plane in a vacuum chamber, with a mask wire disposed at a distance from the cleavage plane and extended in a direction perpendicular to the cleavage-plane step line, by which a pair of metal thin film electrodes, which have marginal edges facing each other across a gap corresponding to the mask wire and each have, on its surface, a surface step line corresponding to the cleavage-plane step line, are formed on the cleavage plane; and evaporating a material for thin wires to be formed onto the pair of metal thin films to grow nano-size thin wires of the material so that they extend from the surface step lines on the metal thin film electrodes toward each other in the gap.

The nano-size thin wire device according to the present invention includes: an ionic single-crystal substrate having a cleavage plane with at least one cleavage-plane step line formed therein; a pair of metal thin film electrodes formed in the cleavage plane of the single-crystal substrate and having marginal edges adjacent but spaced apart from each other to define therebetween a gap extending in a direction intersecting the cleavage-plane step line, a surface step line corresponding to the cleavage-plane step line being formed on the surface of each thin film electrode; and nano-size thin wires extended along the surface step lines on the pair of metal thin film electrodes and having their tips connected to each other in the gap, and thus electrically coupled to each other.

BRIEF DESCRIPTION OF THE DRAWINGS

FIG. 2A is a schematic diagram for explaining the evaporation of the metal thin film electrodes;

FIG. 2B is a schematic diagram showing evaporation for the formation of the thin wires;

DESCRIPTION OF THE PREFERRED EMBODIMENT

Figure 1A:
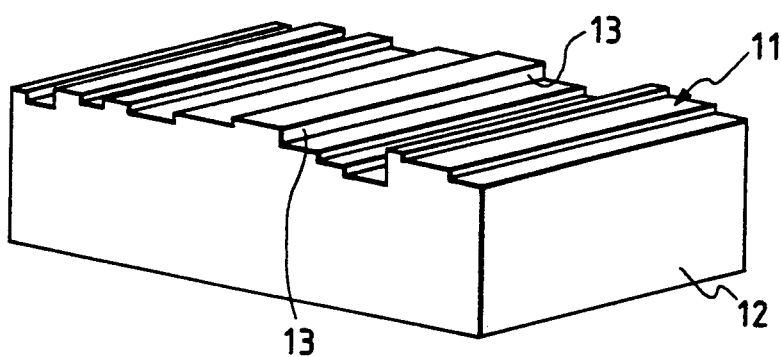
FIG. 1A is a perspective view showing an example of a single-crystal substrate having a cleavage plane.

Referring now to the drawings, an embodiment of the present invention will be described. A single crystal of magnesium oxide (MgO), which is an ionic crystal, is cleaved in parallel to the (100) crystal plane by means of a jig using a knife edge, providing a single-crystal substrate 12 having a cleavage plane 11 formed by the (100) crystal plane as shown in FIG. 1A. In the cleavage plane (the top in this example) of the single-crystal substrate 12 a number of parallel straight step lines 13, spaced about 80 μm apart, are formed by the cleavage of the crystal. The step lines 13 are each a step perpendicular to the substrate surface and the step is straight. The height of the step of each step line 13 may preferably be in the range of between 10 and 100 nm.

Figure 1B:
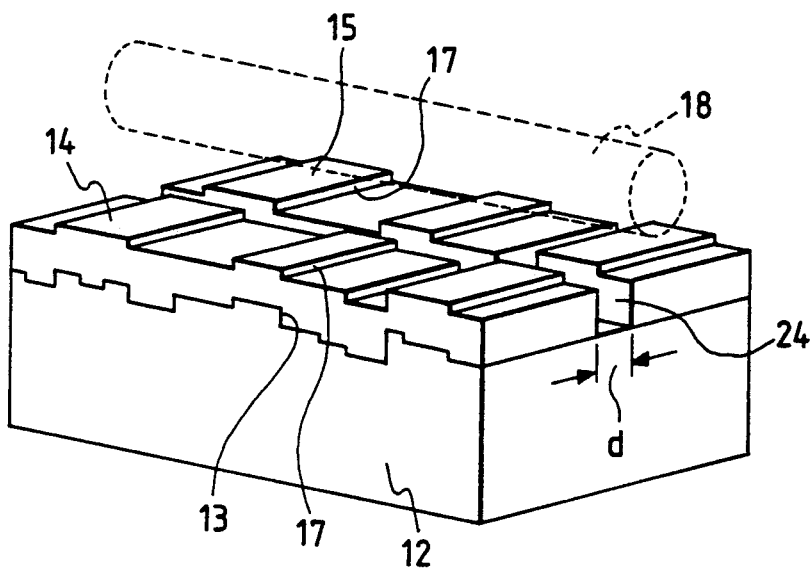
FIG. 1B is a perspective view showing the single-crystal substrate with metal thin film electrodes formed in its cleavage plane.

As shown in FIG. 1B, a pair of metal thin film electrodes 14 and 15, which have parallel marginal edges facing each other across a gap 24 of a width d, are epitaxially grown on the (100) cleavage plane 11 of the single-crystal substrate 12. The marginal edges of the metal thin film electrodes 14 and 15, which define therebetween the gap 24, are formed in a direction substantially perpendicular to the direction of extension of the step line 13, and step lines 17, each corresponding to the step line 13, are formed on the metal thin film electrodes 14 and 15, respectively. Such spaced-apart metal thin film electrodes 14 and 15 can be formed by evaporating a metal for the electrodes onto the cleavage plane 11 of the substrate 12, with a metal wire disposed as a mask above the substrate surface. That is, a platinum (Pt) mask wire 18 is disposed above the cleavage plane 11 substantially in parallel thereto and essentially at right angles to the step line 13 and is fixed at both ends to the substrate 12 by fixing means (not shown). The spacing of the cleavage plane 11 and the mask wire 18 is sufficiently greater than the thickness of each of the metal thin film electrodes 14 and 15 to be formed, preferably, nearly equal to or tens of times larger than the thickness of the mask wire 18.

Figure 1C:
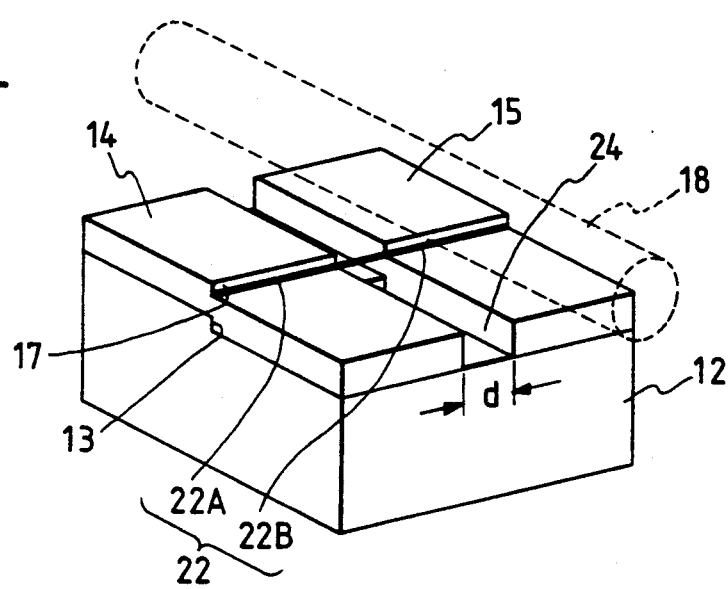
FIG. 1C is an enlarged perspective view showing the state in which thin wires are formed.

FIG. 1C shows the thin wire 22, including wires 22A and 22B, grown along the step lines 17 of the metal film electrodes 14 and 15, respectively. The thin wires 22A and 22B are connected to each other at the center of the gap 24 to form the single wire 22.

As depicted in FIG. 2A, the substrate 12 is mounted on a sample holder 19 in a high vacuum ($2 \times 10^{-8}$ Torr) evaporating chamber 31, with the mask wire 18 held under the substrate surface. After degassing the single-crystal substrate 12 by heating it to 220° C. with a heater 32, gold (Au) which is an evaporation source 21 is vaporized by heating with a heater 25 and is evaporated onto the cleavage plane 11 of the single-crystal substrate 12. The evaporation rate is chosen in the range of 2 to 4 nm/min, for example, 3 nm/min, and the thickness of the thin film is set to 100 to 2000 nm. The evaporation rate and the substrate temperature are chosen so that the evaporated metal thin films are epitaxially grown on the cleavage plane 11 of the single-crystal substrate 12. No gold is evaporated onto the area of the substrate surface masked by the mask wire 18, forming the gap 24 of the width d. Since the outer diameter of the evaporation source 21 is as large as several centimeters, evaporated gold atoms somewhat go around to the back of the mask wire 18, and consequently, the width d of the gap 24 can be made smaller than the diameter of the mask wire 18. By disposing the mask wire 18 at a sufficient distance from the cleavage plane 11, thin wires 22A and 22B, described later on, are permitted to bridge the gap 24 in the rear of the mask wire 18 on the opposite side from the evaporating source 21.

If the evaporated films are too thick, then no step lines 17 will be formed in the metal thin film electrodes 14 and 15. When the height of the step of the step line 13 is too small, the step lines 17 will not be formed either. When the step is too high or the film thickness is too small, the metal thin film electrodes 14 and 15 will not be formed at the step line 13, that is, they will be discontinuous there, and the step lines 17 will not be provided either.

The width d of the gap 24 is determined by the diameter of the mask wire 18, the spacing of the mask wire 18 and the substrate 12 and the size of the evaporation source 21. The diameter of the mask wire 18 is selected, for example, 10 μm, and in this instance, the gap 24 of the width d in the range of 0.5 to 10 μm, for example, is formed. The evaporated metal thin film electrodes 14 and 15 become epitaxially grown Au (111) films under the influence of interatomic distances of MgO atoms of the MgO single-crystal substrate 12. By the epitaxial growth of metal thin films on the single-crystal substrate as described above, the step lines 17 with sharp edges, corresponding to the underlying step line 13, can be formed on the surfaces of the metal thin film electrodes 14 and 15. It is noted that embryos of thin wires are found to be formed at the edges of the electrodes 14, 15 during the electrode formation. In some cases, the embryos grew into wires in contact with the bottom of the gap 24, i.e., the surface of the MgO substrate 12 especially when the substrate 12 was heated above 220° C.

Figure 5:
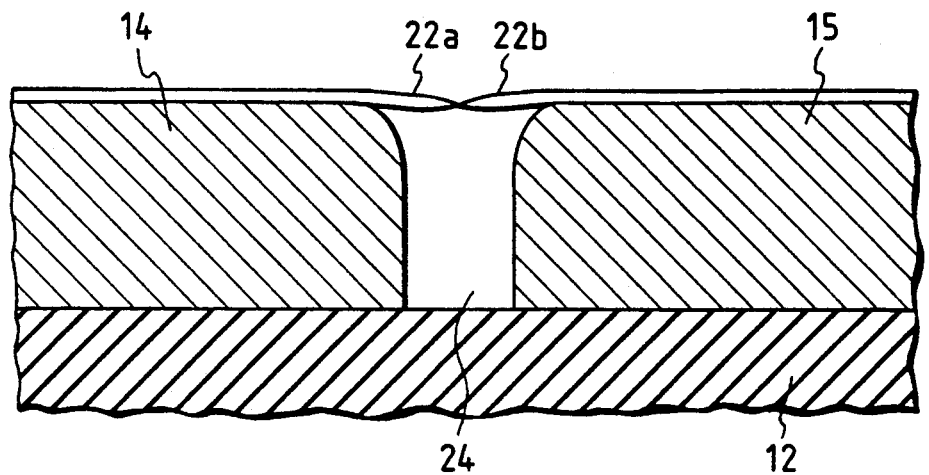
FIG. 5 is a schematic diagram showing a point-contact device formed by thin wires.

Next, metal thin wires 22A and 22B are grown along the step lines 17 of the metal thin film electrodes 14 and 15 so that they are connected to each other, as shown in FIGS. 1C and 5. That is, as shown in FIG. 2B, the single-crystal substrate 12 held by the sample holder 19 is heated by the heater 25 to 220° to 280° C. and gold is evaporated onto the metal thin film electrodes 14 and 15 at an evaporation rate of 0.1 to 0.4 nm/min, lower than the evaporation rate for the formation of the metal thin film electrodes 14 and 15. Since the substrate temperature is high, gold atoms flying to the gold (111) crystal plane are likely to migrate and they gather in voids in the surface of each thin film electrode so that the exposed area of film surface is minimized to stabilize the film surface. Consequently, the gold atoms are concentrated along the lower corners of the step lines 17 and nano-size gold thin wires 22A and 22B with diameters in the range of 50 to 300 nm, just like whiskers, crystal-grown projecting from the end portions of the step lines 17 into the gap 24. The thin wires 22A and 22B thus grown are connected to each other at the center of the gap 24 to form one nano-size thin wire 22 (FIGS. 1C and 5). During the evaporation of the gold for the formation of the thin wires 22A and 22B the mask wire 18 may be removed. The reason for this is that since the evaporation rate for the growth of the thin wires is very low but their growth rate is high, evaporated atoms are not so much deposited as to fill up the gap 24 until the thin wires 22A and 22B are connected to each other.

The states of connection and growth of the thin wires 22A and 22B can be known by observing a current flowing into the thin wires 22A and 22B while applying a voltage across the metal thin film electrodes 14 and 15 from a voltage source 34 via a current measuring instrument 34. For example, in the case of producing a nano-size thin wire resistance device, the thin wires 22A and 22B are connected at their tips above the gap 24 to form the nano-size thin wire interconnecting the metal thin film electrodes 14 and 15, followed by annealing at about 220° C. for 12 hours or so. Thereafter, the substrate temperature is gradually reduced. In this way, a resistance device which has the nano-size thin wire 22 of a resistance value ranging from tens to hundreds of ohms, for example, can be obtained.

Figure 3:
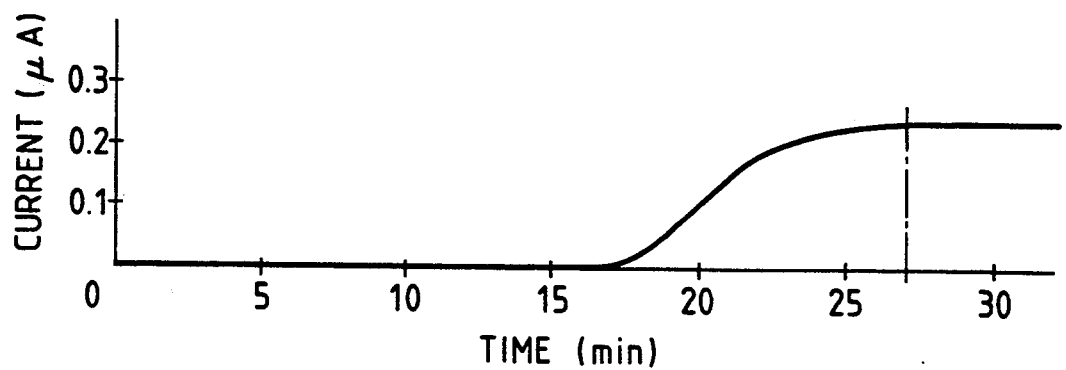
FIG. 3 is a graph showing current variations across metal thin film electrodes 14 and 15 during the formation of the thin wires.

FIG. 3 shows current variations after the start of evaporation for the formation of thin wires in the case where the temperature of the single-crystal substrate 12 was held in the range of between 220° and 280° C., the evaporation rate was 0.3 nm/min and a voltage of 40 mV was applied across the metal thin film electrodes 14 and 15 via a 100 kΩ current limiting resistor. About 17 minutes, or sometimes longer depending on the gap distance, after the start of evaporation, the both thin wires 22A and 22B contact each other and current begins to flow thereacross, after which the contact portion is gradually grown and the current flow increases with time. Since the current becomes saturated after around 25 minutes, the evaporation needs to be continued for about 27 minutes after the start of evaporation to ensure good connection of the thin wires 22A and 22B through their sufficient growth.

Figure 4:
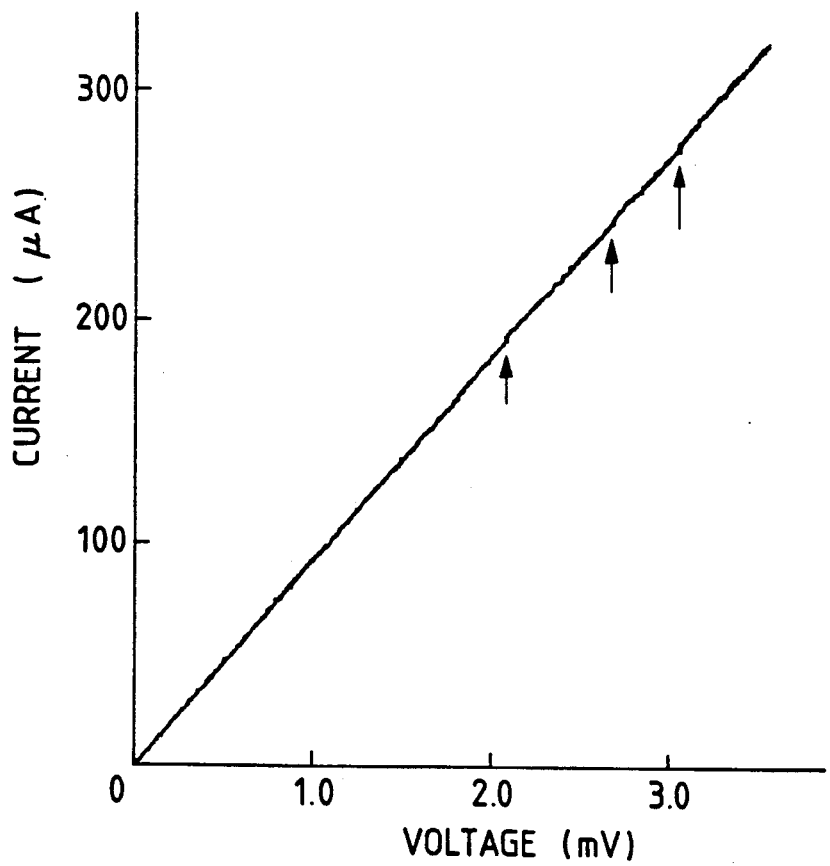
FIG. 4 is a graph showing an example of the current-voltage characteristic of a thin wire 22.

FIG. 4 shows, by way of example, the current-voltage characteristic of such an excellent gold thin wire 22 with a diameter of about 50 nm and a length of about 2 μm at room temperature in a vacuum. As seen from the graph, the current increases with an increase in the voltage, and in the course of such an increase in the current, the current slightly increases stepwise as indicated by arrows—this is against Ohm's law.

The thin wire 22 obtained as mentioned above is cut when it is heat treated again at 200° to 300° C. It can be observed by the current measuring instrument 34 that the thus separated thin wires are connected to each other again when the substrate temperature is reduced very slowly several degrees. At that temperature the gold thin wires 22a and 22b make point contact at their tips as shown in FIG. 5, and by controlling the substrate temperature to move less than 1° C. up or down about that temperature, the point contact state (or the contact area) can be changed. A thin wire device with the thin wires 22a and 22b held in point contact with each other will hereinafter be referred to as a point-contact device.

Figure 6:
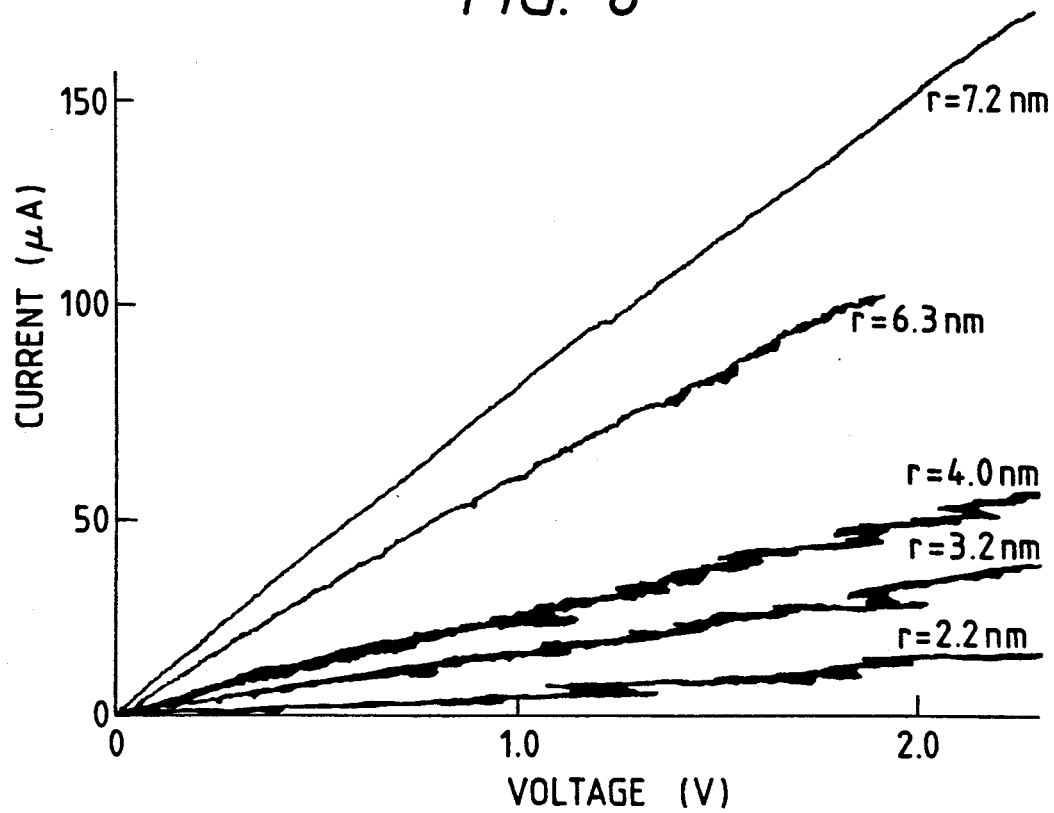
FIG. 6 is a graph showing the point-contact current vs. voltage characteristic of the point-contact device in each point contact area.

FIG. 6 shows point-contact current vs. voltage characteristics for respective point-contact areas (indicated by a radius r), obtained by varying the temperature of the point-contact device of FIG. 5 about 0.1° C. above and below 150° C. in a vacuum. It is seen from FIG. 6 that as the point contact area decreases, non-linearity of the point-contact current with respect to voltage increases and a noise current by so called 1/f noise increases.

Figure 7:
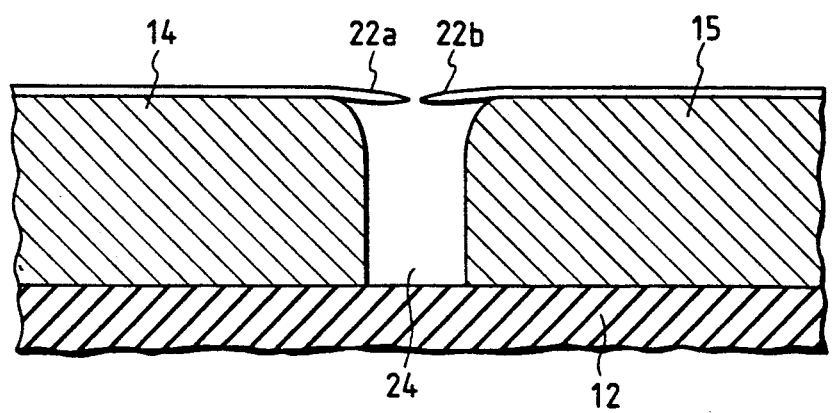
FIG. 7 is a schematic diagram illustrating a tunnel current device formed by thin wires.

When the substrate temperature is reduced down to room temperature without annealing the thin wire 22 after completion of the connection of the thin wires 22A and 22B by their growth, the thin wire 22 is cut into the thin wires 22a and 22b as depicted in FIG. 7. When the tips of the thin wires 22a and 22b are spaced about 0.3 nm apart as shown in FIG. 7, a tunnel current flows across them. Such a thin wire device will hereinafter be referred to as a tunnel current device.

Figure 8:
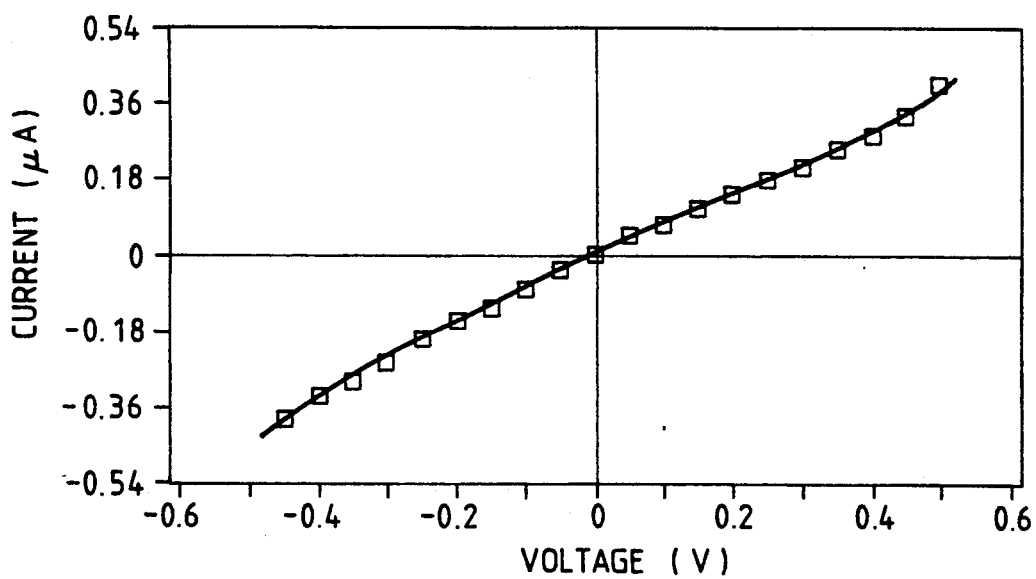
FIG. 8 is a graph showing the tunnel current vs. voltage characteristic of the tunnel current device depicted in FIG. 7.

FIG. 8 shows the tunnel current, in a vacuum, of the tunnel current device wherein the spacing of the tips of the gold thin wires 22a and 22b is 0.3 nm or so. As is evident from FIG. 7, the current-voltage characteristic is markedly nonlinear.

In the above, the single-crystal substrate 12 is not limited specifically to the MgO single crystal but single crystals of ordinary oxides and other arbitrary ionic single crystals can be used so long as the single-crystal substrates have the cleavage property like ionic single crystals and permit the formation of the step line 13 in the cleaved surface. The material for the metal thin film electrodes 14 and 15 is not limited specifically to gold (Au) but other metals may also be used. Similarly, the thin wires 22A and 22B are not limited specifically to the gold (Au) and may also be formed using any arbitrary metals or semiconductors so long as they are grown as whiskers. The metal thin film electrodes 14 and 15 and the thin wires 22A and 22B need not be formed of the same material. It is also possible to form the metal thin film electrodes by maintaining the condition for the growth of the thin wires 22A and 22B after they are grown and connected to each other.

As described above, according to the present invention, nano-size thin wires which are not in direct contact with the single-crystal substrate can be produced, at one time, by a number equal to the product of the number of step lines and the number of gaps; for instance, tens of nano-size thin wires can be obtained at one time. Moreover, they can be produced relatively easily by evaporation in a short time. Since the nano-size thin wires are not in direct contact with the substrate, they are free from physical and chemical influences of the substrate and they can be cut off with ease.

What is claimed is:

1. A nano-size thin wire making method, comprising the steps of:
    a) providing a single-crystal substrate having a cleavage plane with at least one cleavage-plane step line formed therein by cleaving an ionic single crystal;
    b) evaporating a metal onto said cleavage plane in a vacuum chamber, with a mask wire disposed at a distance from said cleavage plane and extended in a direction intersecting the cleavage-plane step line;
    c) forming a pair of metal thin film electrodes, which have marginal edges facing each other across a gap corresponding to the mask wire and each having, on its surface, a surface step line corresponding to the cleavage-plane step line, on the cleavage plane; and
    d) evaporating a semiconductive or conductive material onto the pair of metal thin film electrodes to grow nano-size thin wires from the surface step lines on the pair of metal thin film electrodes so that the thin wires are connected to each other at their tips above the gap.

2. A method according to claim 1, wherein said step c) of forming the pair of metal thin film electrodes includes a substep of epitaxially growing the metal on the cleavage plane.

3. A method according to claim 1, wherein the mask wire is platinum wire.

4. A method according to claim 1, wherein said step d) of growing nano-size thin wires includes the substeps of:
    i) applying voltage across the metal thin film electrodes;
    ii) observing a current across the electrodes; and
    iii) stopping the evaporation of the material when the current reaches a desired value.

* * * * *